United States Patent
Chen

(10) Patent No.: US 7,406,411 B2
(45) Date of Patent: Jul. 29, 2008

(54) BIT ERROR CONCEALMENT METHODS FOR SPEECH CODING

(75) Inventor: Juin-Hwey Chen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 713 days.

(21) Appl. No.: 10/222,933

(22) Filed: Aug. 19, 2002

(65) Prior Publication Data
US 2003/0036901 A1 Feb. 20, 2003

Related U.S. Application Data

(60) Provisional application No. 60/344,378, filed on Jan. 4, 2002, provisional application No. 60/312,794, filed on Aug. 17, 2001.

(51) Int. Cl.
*G10L 21/00* (2006.01)
*G10L 21/02* (2006.01)

(52) U.S. Cl. .................. 704/228; 704/225; 704/226

(58) Field of Classification Search ............... None
See application file for complete search history.

(56) References Cited

U.S. PATENT DOCUMENTS

| | | | |
|---|---|---|---|
| 5,327,520 A | | 7/1994 | Chen |
| 5,506,899 A | * | 4/1996 | Kimura ............. 455/563 |
| 5,745,871 A | | 4/1998 | Chen |
| 5,794,180 A | * | 8/1998 | McCree ............. 704/212 |
| 5,907,822 A | * | 5/1999 | Prieto, Jr. ............. 704/202 |
| 6,014,621 A | | 1/2000 | Chen |
| 6,205,130 B1 | * | 3/2001 | DeJaco ............. 370/335 |
| 6,658,112 B1 | * | 12/2003 | Barron et al. .......... 380/275 |
| 6,968,309 B1 | * | 11/2005 | Makinen et al. ......... 704/219 |

FOREIGN PATENT DOCUMENTS

| | | | |
|---|---|---|---|
| WO | WO 91/05333 | * | 4/1991 |
| WO | WO 96/27183 A2 | | 9/1996 |
| WO | WO 98/13941 A1 | | 4/1998 |

OTHER PUBLICATIONS

Supplementary European Search Report for European Patent Appl. No. 02759394.6, 3 pages, dated Apr. 15, 2005.
U.S. Appl. No. 09/722,077, filed Nov. 27, 2000, Chen.

(Continued)

*Primary Examiner*—David R. Hudspeth
*Assistant Examiner*—Brian L Albertalli
(74) *Attorney, Agent, or Firm*—Sterne, Kessler, Goldstein & Fox P.L.L.C.

(57) ABSTRACT

A system and method of concealing bit errors in a signal are provided. An exemplary method detects bit errors in an input signal having at least a current signal segment and a previous signal segment. The previous signal segment has a log-gain value qlg(m−1) and immediately precedes the current signal segment. The method comprises estimating a level lvl(m−1) of the input signal and determining a log-gain value qlg(m) of the current signal segment within the input signal. The method also comprises determining a difference between the gain value of the current signal segment and the previous signal segment and determining whether the difference exceeds a threshold. wherein the threshold is adaptive to the input signal level.

10 Claims, 8 Drawing Sheets

OTHER PUBLICATIONS

Su, H.Y. and Mermelstein, P., "Improving The Speech Quality Of Cellular Mobile Systems Under Heavy Fading," *Acoustics, Speech, and Signal Processing*, IEEE, vol. 2, pp. 121-124 (1992).

Chen, J.H., "A High-Fidelity Speech And Audio Codex With Low Delay And Low Complexity," *Acoustics, Speech, and Signal Processing*, IEEE, vol. 2, pp. 1161-1164 (2000).

International Search Report from PCT Appl. No. PCT/US02/26315, filed Aug. 19, 2002, 7 pages (mailed Dec. 4, 2002).

International Search Report from PCT Appl. No. PCT/US02/26254, filed Aug. 19, 2002, 4 pages (mailed Feb. 25, 2003).

* cited by examiner

US 7,406,411 B2

BIT ERROR CONCEALMENT METHODS FOR SPEECH CODING

CROSS-REFERENCE TO RELATED APPLICATIONS

This application claims the benefit of U.S. Provisional Application No. 60/312,794, filed Aug. 17, 2001, entitled "Bit Error Concealment Methods for Speech Coding," and U.S. Provisional Application No. 60/344,378, filed Jan. 4, 2002, entitled "Improved Bit Error Concealment Methods for Speech Coding," both of which are incorporated by reference herein in their entireties.

BACKGROUND OF THE INVENTION

1. Field of the Invention

This invention relates to digital communications, and more specifically to the enhancement of speech quality when a bit stream representing a speech signal is subject to bit errors.

2. Related Art

In speech coding, sometimes called voice compression, a coder encodes an input speech or audio signal into a digital bit stream for transmission or storage. A decoder decodes the bit-stream into an output speech signal. The combination of the coder and the decoder is called a codec. When a transmission channel or storage medium introduces bit errors to the bit stream received by the decoder, the decoded speech will be degraded compared with the speech decoded from an error-free bit stream.

There are various ways for addressing bit errors. One well-known approach is forward error control, where a transmitter transmits additional redundant bits in such a way that allows a corresponding receiver to detect or even correct certain bit errors. With enough redundant bits transmitted, this scheme can be made very robust to bit errors. However, a drawback is that the overall bit rate is significantly increased by the transmission of redundant bits.

A second approach is to optimize quantizers within the codec for noisy channels with bit errors. Given a target bit error rate, in the design phase, the codec quantizers can be optimized to give a decoded signal that is better in the mean-squared error (MSE) sense, without the need to transmit redundant bits for forward error control. The problem is that such noisy-channel-optimized quantizers often have dynamic ranges smaller than the dynamic ranges of quantizers optimized for clear channel (i.e. channel free of bit errors). As a result, although the codec's performance is improved for the target bit error rate, for clear channel there is often a noticeable degradation in performance.

What is needed therefore is a technique for concealing bit errors in signals that exploits the natural redundancy in the transmitted signal parameters but does not degrade codec performance.

SUMMARY OF THE INVENTION

Consistent with the principles of the present invention as embodied and broadly described herein, an exemplary method of practicing the invention detects bit errors in an input signal having at least a current signal segment and a previous signal segment. The previous signal segment has a log-gain value $qlg(m-1)$ and immediately precedes the current signal segment. The method comprises estimating a level $lvl(-m1)$ of the input signal and determining a log-gain value $qlg(m)$ of the current signal segment within the input signal. The method also comprises determining a difference between the gain value of the current signal segment and the previous signal segment and determining whether the difference exceeds a threshold, wherein the threshold is adaptive to the input signal level.

The present invention is similar to the second approach discussed above in that it does not require the transmission of redundant bits. However, the difference is that the present invention does not rely on reducing the quantizer's dynamic range to achieve the desired robustness against bit errors. Instead, the present invention exploits the natural redundancy in the transmitted speech parameters, such as gain or pitch period, to detect erroneously decoded speech parameters due to bit errors. Although the instant invention can be used with noisy-channel-optimized quantizers for these speech parameters, it can also be used with clear-channel-optimized quantizers.

When used with clear-channel-optimized quantizers, the present invention can provide speech quality enhancements similar to those achieved by noise-channel-optimized quantizers when there are bit errors. The present invention, however, can have less performance degradation (i.e. better speech quality) for clear channel than using noisy-channel-optimized quantizers.

Further embodiments, features, and advantages of the present invention, as well as the structure and operation of the various embodiments of the present invention, are described in detail below with reference to the accompanying drawings.

BRIEF DESCRIPTION OF THE DRAWINGS

The accompanying drawings, which are incorporated in and constitute a part of the specification, illustrate an embodiment of the invention and, together with the description, explain the purpose, advantages, and principles of the invention. In the drawings.

DETAILED DESCRIPTION OF THE INVENTION

Figure 1:
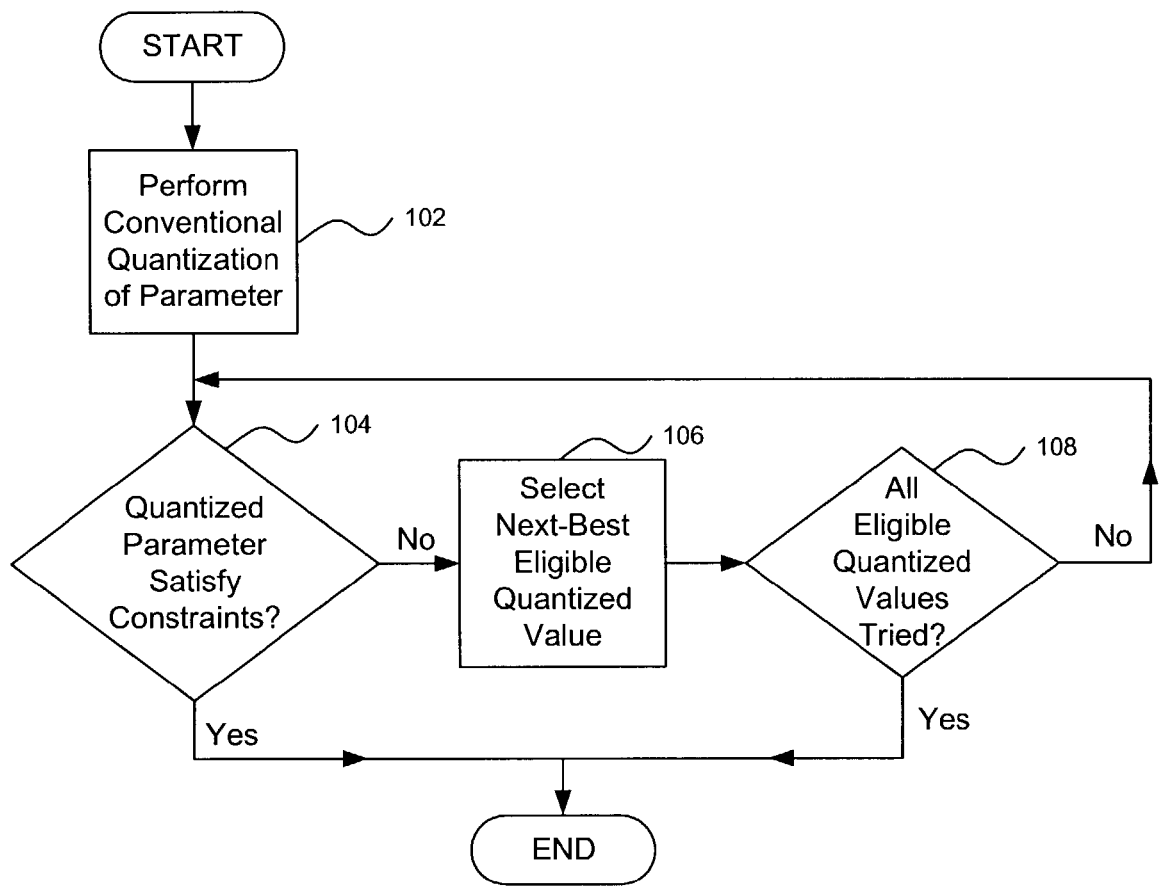
FIG. 1 is a flowchart of an exemplary encoding process of the present invention.

The following detailed description of the present invention refers to the accompanying drawings that illustrate exemplary embodiments consistent with this invention. Other embodiments are possible, and modifications may be made to the embodiments within the spirit and scope of the present invention. Therefore, the following detailed description is not meant to limit the invention. Rather, the scope of the invention is defined by the appended claims.

It would be apparent to one of skill in the art that the present invention, as described below, may be implemented in many different embodiments of hardware, software, firmware, and/or the entities illustrated in the drawings. Any actual software code with specialized control hardware to implement the present invention is not limiting of the present invention. Thus, the operation and behavior of the present invention will be described with the understanding that modifications and variations of the embodiments are possible, given the level of detail presented herein. Before describing the invention in detail, it is helpful to describe an exemplary environment in which the invention may be implemented.

The present invention is not restricted to any particular type of speech codec. It is generally applicable to any speech codec employing quantizers to quantize certain speech parameters that have sufficient natural redundancy between adjacent samples of such parameters.

In a typical speech codec, the encoder extracts certain speech parameters, quantizes them, and transmits them as side information to the decoder. The decoder decodes such side information and uses the decoded speech parameters to decode the speech signal. Examples of such codecs include, but are not limited to, Adaptive Predictive Coding (APC), Multi-Pulse Linear Predictive Coding (MPLPC), Code Excited Linear Prediction (CELP), and Noise Feedback Coding (NFC), Sub-Band Coding (SBC) with adaptive bit allocation, and Adaptive Transform Coding (ATC). The speech parameters transmitted may include the spectral envelope information, the pitch period, and the gain (energy level) of the signal, etc. These speech parameters are typically extracted at a fixed time interval once per frame (5 ms to 40 ms) or once per sub-frame (1 ms to 10 ms).

The samples of any given extracted speech parameter form a time sequence that can be viewed as a digital waveform itself. Such a speech parameter waveform has some natural redundancy. That is, it cannot be completely random. This is because the speech signal is produced by a physical apparatus (i.e., the human speech production system, which includes vocal cords, a vocal tract, and a nasal cavity, etc.).

The mechanical motions within this apparatus are constrained in some natural ways and cannot be arbitrary. Consequently, certain combinations of adjacent speech parameter samples will never occur in natural speech. For example, in the middle of a high-energy vowel region of a natural speech, it is impossible for the signal energy to increase suddenly by 30 or 40 dB in a matter of 5 ms.

In the present invention, the codec is trained to know the speech parameter combinations that are impossible or extremely unlikely in natural speech. For convenience of discussion, such speech parameter combinations are referred to herein as prohibited combinations. Once trained, the encoder checks for prohibited combinations when quantizing a given speech parameter. If a prohibited combination is found in the quantized speech parameter sequence, the quantizer operation is modified so that the quantizer chooses a different quantized speech parameter sample that forms an allowed combination. Because of such checking at the encoder, the speech parameter sequences transmitted by the encoder do not contain any prohibited combinations.

The decoder performs the same kind of checking for prohibited combinations of speech parameters. Since the transmitted speech parameter sequences do not contain any prohibited combinations, if the decoder detects any prohibited combination, it must be caused by bit errors. Thus, rather than using the bit-error-corrupted speech parameter value for the current frame or sub-frame, the decoder can use another more suitable replacement parameter value. This replacement parameter value can be obtained by extrapolating from correctly decoded speech parameter samples of previous frames or sub-frames. The replacement value can also be obtained from interpolation if the coding scheme is such that some future decoded parameter values are also available. In this way, the present invention allows the decoder to detect certain bit errors and take steps to conceal the degradation effects of such bit errors, without requiring the transmission of redundant bit for forward error correction or detection.

It should be noted that the word combination in the phrases prohibited combination or allowed combination has a very generic meaning. It is not meant to be defined narrowly as the combination of the speech parameter sample of the current frame (or sub-frame) and the sample value of the same speech parameter in the last frame (or sub-frame). In the general sense, the word combination can mean the combination of any number of speech parameter samples. It can even mean the combination of speech parameter samples and some values derived from such parameter samples, such as the sample difference, local sample mean, and local sample variance, etc.

In the most general sense, the combination does not even have to be limited to values derived from a given type of speech parameter. The combination can be across different transmitted speech parameters, or even across transmitted speech parameters and some parameters that are not transmitted but are derived locally from quantized signals. The idea is to use a combination of parameters that allows the easiest or most effective detection of bit errors, as long as such a combination of parameters can be checked at both the encoder and the decoder. Also, it is not necessary to try to detect all prohibited combinations. Embodiments of the present invention may be configured to detect only those prohibited combinations that give rise to large audible distortion.

The following simple example illustrates the basic principles of the present invention. Assume a speech codec transmits the logarithmic value of the signal gain (referred to herein as log-gain) once a sub-frame. Suppose that it is desirable to detect certain bit errors that cause the decoded log-gain to be much larger than the transmitted log-gain (thus causing a large audible "pop" in the decoded speech). One simple choice is to check the combination of the log-gain of the current sub-frame and the log-gain of the last sub-frame.

In a training phase, the possible range of log-gains is divided into many non-overlapping bins, with each bin covering a few decibels. A very long speech file is encoded by the codec, and the quantized log-gain of each sub-frame is recorded. For all log-gains that fall into a given bin, the subsequent log-gains in the next sub-frames are examined, and the maximum of them is recorded. The maximum found this way is a conditional maximum that is conditioned on the log-gain of the last sub-frame being inside the given bin. After the conditional maxima of all bins are found, they are saved in a table.

During an actual gain encoding operation, the quantized log-gain of the current sub-frame is compared with the stored conditional maximum corresponding to the bin that the quantized log-gain of the previous sub-frame falls into. If this maximum is exceeded, the next largest output level of the log-gain quantizer codebook is used to reconstruct a smaller quantized log-gain, and this smaller quantized log-gain is compared with the conditional maximum again. This process is repeated until the quantized log-gain is smaller than the conditional maximum, or until the smallest log-gain quantizer level has been reached, whichever event happens first. After such a modified operation of the log-gain encoder, the transmitted bit stream will not contain a quantized log-gain that exceeds the conditional maximum and at the same time is not reconstructed from the smallest log-gain quantizer level.

In the decoder, if the decoded log-gain exceeds the conditional maximum (conditioned on the previous log-gain) and is not reconstructed from the smallest log-gain quantizer level, then it must be caused by bit error(s). When this happens, the gain decoder can simply replace the decoded log-gain with the log-gain of the last sub-frame. This will avoid a potentially audible "pop" in the output speech.

Many variations of the simple example above are possible. For example, the conditional maxima merely serve as thresholds for comparison to determine when to replace the decoded log-gain by the log-gain of the last sub-frame. Therefore, it may be advantageous to lower such thresholds to make sure that most audible pops caused by gain bit errors can be detected.

In another example, rather than condition the thresholds on the log-gain of the last sub-frame only, the present invention can condition the thresholds on the log-gains of the last sub-frame and the sub-frame before that. This approach is similar to going from a first-order predictor to a second-order predictor. By observing two consecutive log-gains, the present invention can better predict the likely range of the next log-gain that natural speech will produce.

As yet another example, in addition to the log-gain, the present invention can also condition the thresholds on other parameters, such as the first normalized autocorrelation coefficient and the zero-crossing rate of previously decoded speech waveform.

In summary, the present invention places a set of constraints on the encoding operations of a speech parameter quantizer. At the decoder, the decoded speech parameter is compared against the same set of constraints, and if a violation of the constraints is detected, the decoder declares that the decoded speech parameter is invalid due to bit errors. The decoded speech parameter is then discarded and substituted by a suitable replacement value obtained from adjacent decoded speech parameters that are assumed to be valid.

The set of constraints is selected such that (1) it is rarely or never violated in the encoder while encoding natural speech, and (2) when it is violated in the decoder (after enforcing the constraints in the encoder), it corresponds to a bit-error-corrupted speech parameter that is likely to produce significant degradation in the output speech. If the set of constraints is selected to detect most of the bit errors that degrade quality significantly, it is likely that the constraints will also degrade speech quality somewhat when there are no bit errors (i.e. clear channel).

Selecting the constraints involves a trade-off between clear channel performance and noisy channel performance. Thus, the objective in designing such a bit error concealment system is to choose a suitable set of constraints that will allow the system to detect as many quality-degrading bit errors as possible while causing negligible degradation to the clear-channel codec performance. The exemplary embodiment of the present invention, described below, achieves this goal.

Figure 2:
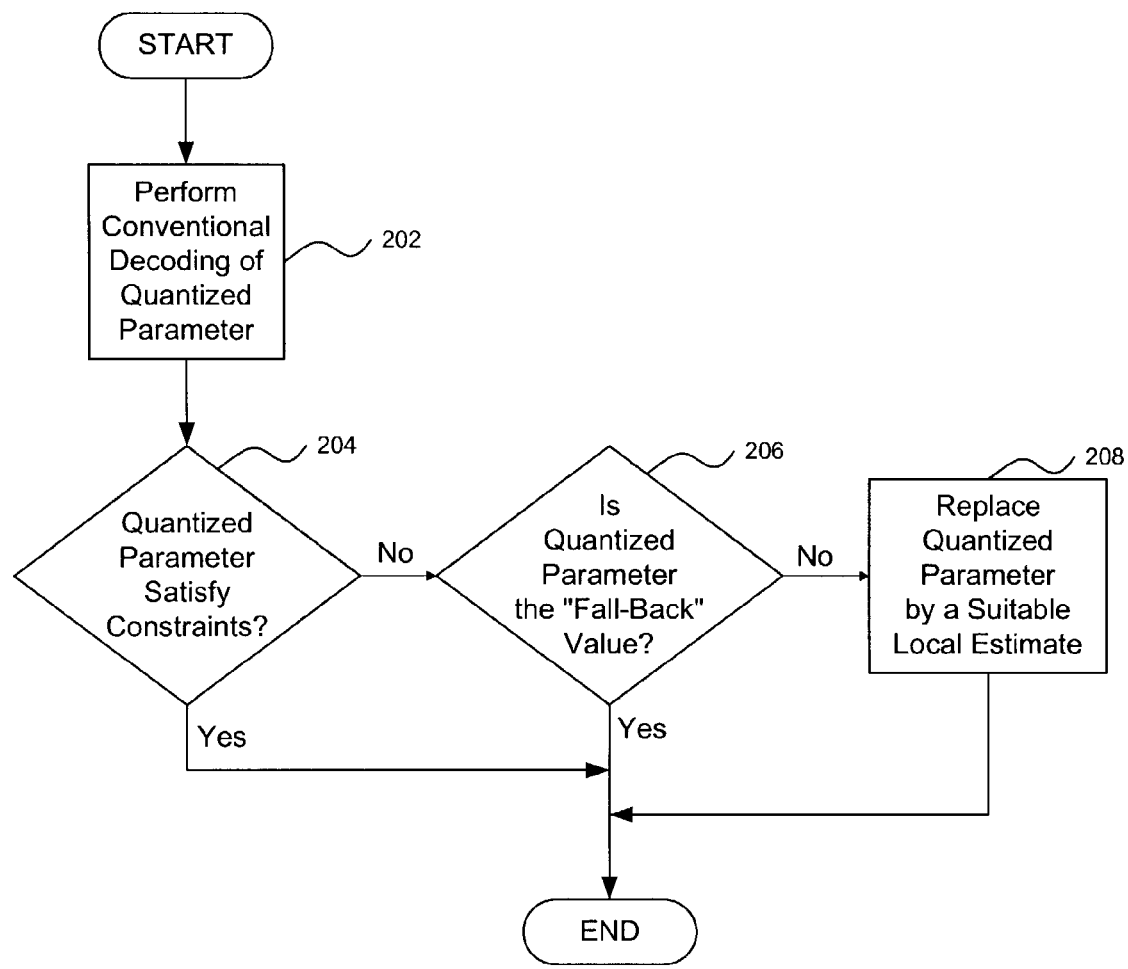
FIG. 2 is a flowchart of an exemplary decoding process of the present invention.

FIGS. 1 and 2 are flowcharts of the general encoding and decoding processes of the instant invention. In FIG. 1, the input parameter is first quantized in a conventional way (step 102). The quantized parameter value is then compared with the predetermined constraints conditioned on certain combination of parameter values (step 104). If it satisfies the constraints, no modification of the quantized parameter value is necessary, and the encoding process is completed.

However, if it does not satisfy the constraints, then the next-best eligible quantized parameter value is selected (step 106). (Here "eligible" means the quantized parameter value can be represented by a legitimate output index of the parameter quantizer, i.e., the decoder can exactly decode this value. Also, "next-best" is in terms of the distortion measure used in the quantization codebook search.)

The present invention then checks whether this value is the last eligible quantized value (step 108). That is, it is checked whether all eligible quantized parameter values have been tried. If not, then the process flow control goes back to the comparison of the quantized parameter value with the constraints (step 104).

This process is repeated until the first eligible quantized value that satisfies the constraints is found. This eligible quantized value is selected as the final quantizer output, and the corresponding codebook index is transmitted. If all eligible quantized values have been tried, and none satisfies the constraints, then the last eligible quantized value is selected as the final quantizer output, and the corresponding codebook index is transmitted. This last eligible quantized value is called the "fall-back" value, because it is transmitted when none of the candidate quantizer output values can satisfy the constraints.

In FIG. 2, the decoder first performs conventional decoding of quantized parameter value (step 202). It is then determined whether the resulting quantized value satisfies the predetermined constraints conditioned on certain parameter combination (step 204). If so, then no more action needs to be taken. If it does not satisfy the constraints, then it is checked whether the decoded parameter value is the "fall-back" value described above (step 206). If so, no more action needs to be done. If not, then the decoded parameter value is discarded and replaced with another suitable local estimate value derived from adjacent decoded parameter values that are assumed to be error-free (step 208).

Although an embodiment of this invention deals with the log-gain quantizer, the same principles in the present invention should also be applicable to bit error concealment of other transmitted speech parameters, such as pitch period, pitch predictor coefficient (or adaptive codebook gain in CELP codecs), and spectral envelope parameters. The same principles may even be useful for bit error concealment in other signal compression systems such as image or video codecs.

In the preferred embodiment of the present invention, a second-order system is used to detect bit errors that produce large decoded log-gains and the corresponding audible pops or glitches. Once these bit errors are detected, the erroneously decoded log-gains are discarded and replaced by a local estimate obtained from adjacent log-gains. Most of the audible pops and glitches caused by gain bit errors can be eliminated by this scheme.

Such a bit error concealment scheme can be readily applied to an instantaneous log-gain quantizer (i.e. a quantizer without memory). However, in the following description of the preferred embodiment, the bit error concealment scheme is used with a more sophisticated predictive log-gain quantizer with moving-average (MA) prediction. Such a predictive gain quantizer is similar to the one used in the ITU-T G.729 speech coding standard.

The preferred embodiment of the of the present invention is used in conjunction with the MA predictive log-gain quantizer in a two-stage noise feedback codec, as described in U.S. patent application Ser. No. 09/722,077, entitled "Method and Apparatus for One-Stage and Two-Stage Noise Feedback Coding of Speech and Audio Signals," filed on Nov. 27, 2000.

Nevertheless, it should be noted that the present invention and even the preffered embodiment of the gain bit error concealment scheme can easily be used in popular CELP or Multi-Pulse LPC codecs.

Figure 3:
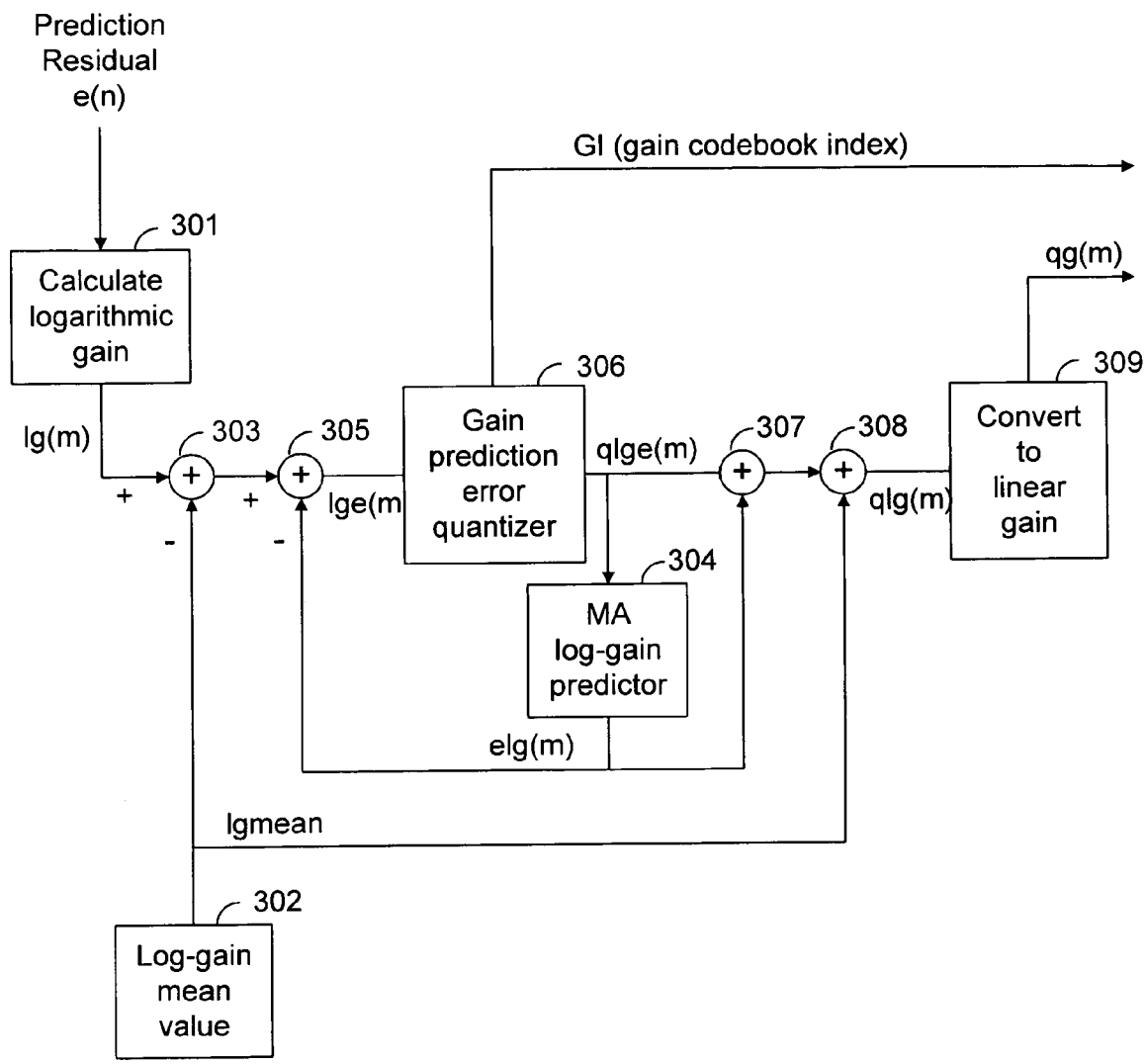
FIG. 3 is a block diagram illustration of an encoder portion of a conventional MA-predictive log-gain quantizer.

To describe the preferred embodiment of the present invention, a conventional MA-predictive log-gain quantizer is described first. FIG. 3 shows the encoder of a typical MA-predictive log-gain quantizer. In the preferred embodiment of this invention in a noise feedback codec, the log-gain of the final prediction residual signal is quantized and transmitted once a sub-frame. The sequence {e(n)} denotes the prediction residual, and let SFRSZ be the sub-frame size in term of number of samples. Without loss of generality, let the current sub-frame have a sub-frame index of m, and let the current sub-frame correspond to sample indices from $n=n_0(m)+1$ to $n=n_0(m)+SFRSZ$, where $n_0(m)$ is the sample offset for the current sub-frame. Then, a block 301 calculates the (base-2) log-gain of the prediction residual once a sub-frame as $$lg(m) = \log_2\left[\frac{1}{SFRSZ} \sum_{n=n_0(m)+1}^{n_0(m)+SFRSZ} e^2(n)\right].$$

The long-term mean value of this log-gain, denoted lgmean, is calculated off-line and stored in a block 302. An adder 303 subtracts this long-term mean value from the output log-gain of the block 301 to get the mean-removed version of the log-gain. An MA log-gain predictor block 304 is an FIR filter with order M. The coefficients of this log-gain predictor are pre-determined off-line and held fixed. The adder 305 subtracts the output of the block 304, denoted elg(m), which is the estimated log-gain, from the mean-removed log-gain. The resulting value is lge(m), or log-gain prediction error for the current sub-frame. A gain prediction error quantizer block 306 quantizes lge(m) into qlge(m). In some CELP codecs, this quantizer may be a vector quantizer that jointly quantizes the log-gain prediction error and the so-called adaptive codebook gain. Here, a simpler case of a scalar quantizer is considered.

The gain quantizer codebook index GI is an output of this MA-predictive log-gain quantizer. The quantized version of the log-gain prediction error qlge(m) is passed to the block 304 to update the MA log-gain predictor memory. An adder 307 adds the predicted log-gain elg(m) to the quantized log-gain prediction error qlge(m) to get the quantized version of the mean-removed log-gain. An adder 308 then adds the log-gain mean value lgmean to get the quantized log-gain, denoted as qlg(m). A block 309 then converts this quantized log-gain to the quantized gain in the linear domain as follows.

$$qg(m)=2^{qlg(m)/2}$$

This quantized linear gain is then used in the encoder of the noise feedback codec to perform excitation coding.

Figure 4:
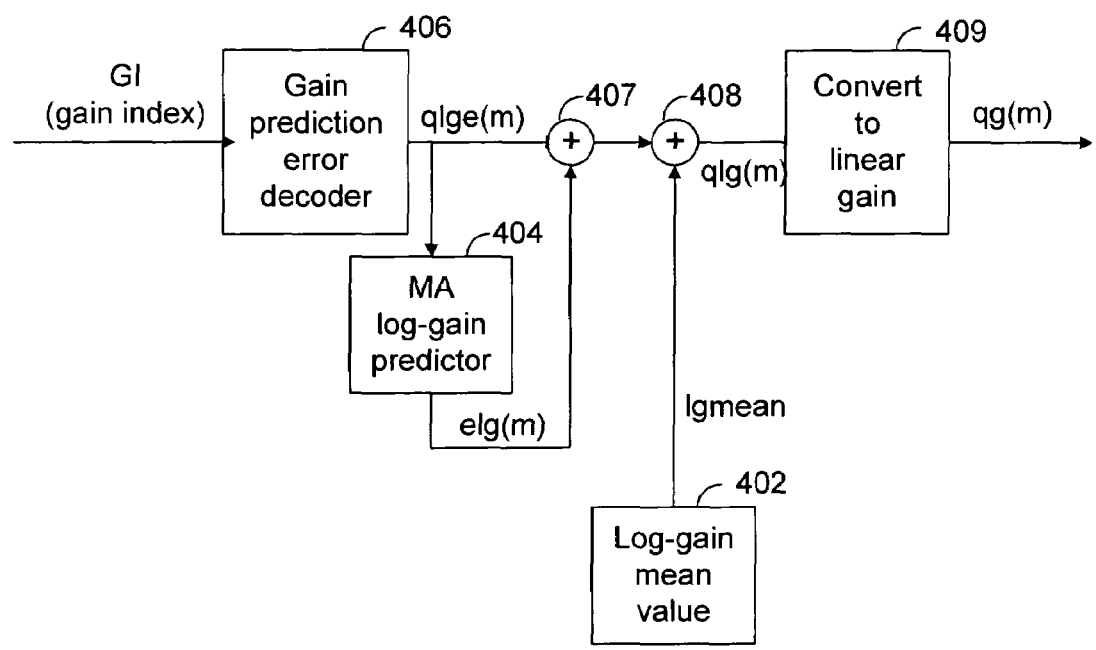
FIG. 4 is a block diagram illustration of a decoder for a conventional MA-predictive log-gain quantizer.

FIG. 4 shows a corresponding decoder for a conventional MA-predictive log-gain quantizer. It basically consists of the right half of FIG. 3, except that a gain prediction error decoder has replaced the gain prediction error quantizer. The gain prediction error decoder takes the gain index GI as input, and decode the corresponding quantizer table value as the output quantized log-gain prediction error qlge(m). The rest of FIG. 4 works the same way as the right half of FIG. 3.

The preferred embodiment of the present invention is a slightly modified version of the conventional MA-predictive log-gain quantizer described above. The preferred embodiment detects gain bit errors by checking whether the amount of change in the decoded log-gain from the last sub-frame to the current sub-frame, denoted as $\Delta qlg(m)=qlg(m)-qlg(m-1)$, exceeds a threshold that is determined by two quantities: (1) the decoded log-gain of the last sub-frame, qlg(m−1), and (2) the amount of change in the decoded log-gain from two sub-frames earlier to the last sub-frame, that is, $\Delta qlg(m-1) = qlg(m-1)-qlg(m-2)$. Since this threshold value is a function of qlg(m−1) and $\Delta qlg(m-1)$, it can be denoted as T(qlg(m−1), $\Delta qlg(m-1)$).

Theoretically, qlg(m−1) and $\Delta qlg(m-1)$ contains the same information as qlg(m−1) and qlg(m−2). Hence, an equivalent threshold function would be T'(qlg(m−1), qlg(m−2))=T(qlg(m−1), $\Delta qlg(m-1)$), and it could be determined whether qlg(m) exceeds qlg(m−1)+T'(qlg(m−1), qlg(m−2)). Mathematically the two approaches are completely equivalent. However, in terms of implementation, using the threshold function T(qlg(m−1), $\Delta qlg(m-1)$) rather than T'(qlg(m−1), qlg(m−2)) allows us to store a smaller array of threshold values. This is because $\Delta qlg(m-1)$ has a smaller dynamic range than qlg(m−2); thus, fewer bins are needed to cover the entire dynamic range of $\Delta qlg(m-1)$.

Before the preferred embodiment is described in detail, the method to "train" the threshold function T(qlg(m−1), $\Delta qlg(m-1)$) is described. First, a very large speech file is chosen as the training file. (If desired, this training file can also contain music, noise, noisy speech, and network signaling tones in addition to clean speech.) Suppose there are N sub-frames in the training file. The entire training file is encoded by the target codec that contains a conventional MA-predictive log-gain quantizer, and the corresponding sequence of quantized log-gains {qlg(m), m=1, 2, 3, . . . , N} are saved in sequence in another file. Then another training program is used to analyze this log-gain file and determine the threshold function. A bin size (or width) of 2 in the base-2 log domain is used. This corresponds to 6.02 dB for the width of each bin for qlg(m−1) or $\Delta qlg(m-1)$. The bin boundaries are chosen as even integers, as in −8, −6, −4, −2, 0, 2, 4, 6, . . . For example, if qlg(m−1)=5.174 and $\Delta qlg(m-1)$=−3.768, then qlg(m−1) is in the bin from 4 to 6, and $\Delta qlg(m-1)$ is in the bin from −4 to −2.

The training program goes through the entire sequence of quantized log-gains {qlg(m), m=1, 2, 3, . . . , N}, and for each sub-frame among m=3, 4, 5, . . ., N, it determines which bins qlg(m−1) and $\Delta qlg(m-1)$ fall into, respectively. If we line up the bins of qlg(m−1) along the X axis and the bins of $\Delta qlg(m-1)$ along the Y axis, then all the populated bins of qlg(m−1) and $\Delta qlg(m-1)$ together form a two-dimensional array of squares in the X-Y plane.

The training program basically performs statistical analysis of $\Delta qlg(m)$ conditioned on each of the populated square in the X-Y plane defined by qlg(m−1) and $\Delta qlg(m-1)$. A simple approach for determining the threshold function T(qlg(m−1), $\Delta qlg(m-1)$) is to use the conditional maximum of $\Delta qlg(m)$ conditioned on each populated square in the X-Y plane defined by qlg(m−1) and $\Delta qlg(m-1)$. In other words, for a given populated square in the X-Y plane, the training program first finds all sub-frames where the qlg and $\Delta qlg$ in their preceding sub-frames fall into the given square in the X-Y plane, and among the $\Delta qlg(m)$ values of these chosen sub-frames, the maximum is used as the threshold function for that particular square in the X-Y plane. By choosing the threshold function this way, it is ensured that at least when the training speech file is encoded by the target codec, the threshold function will never be exceeded, and therefore there will be no degradation in the clear-channel performance of the codec when encoding this training file.

In actual training based on speech, music, and tones, it has been found that with a 5 ms sub-frame size, a 16 by 12 threshold array is sufficient to cover essentially all populated squares in the X-Y plane. The range of populated bins for qlg(m−1) is from −6 to 26 (a total of 16 bins), and the range of populated bins for Δqlg(m−1) is from −8 to 16 (a total of 12 bins). If the sub-frame is 2.5 ms, then a threshold array size of 16 by 11 would be sufficient. Note that if the threshold had been conditioned on qlg(m−1) and qlg(m−2), a 16 by 16 array and thus more storage space for the threshold array would be needed. This illustrates the point mentioned earlier about the advantage of using T(qlg(m−1), Δqlg(m−1)) rather than T'(qlg(m−1), qlg(m−2)).

Although using the conditional maximum ensures that there is no degradation in the clear-channel performance of the codec when encoding the training file, the resulting bit error concealment system can only detect and correct about one-third of the big pops or glitches caused by gain bit errors. The other two-thirds of such pops remain undetected. Therefore, the conditional maximum does not represent a good trade-off between clear-channel performance and noisy-channel performance.

A better trade-off can be achieved by lowering the threshold values. This is accomplished as follows. For each populated square in the X-Y plane the training program collects all the Δqlg(m) values of the sub-frames (with index m) with qlg(m−1) and Δqlg(m−1) falling into that particular square in the X-Y plane. The training program then sorts all such collected Δqlg(m) values for that square. Then, it eliminates (or disqualifies) the largest ε% of such collected Δqlg(m) values, and takes the largest of the remaining Δqlg(m) values as the threshold value for that square. To avoid occasional outliers of Δqlg(m) values that are much larger than the rest, we always eliminate the very largest of the collected Δqlg(m) values, even if doing so means eliminating more than ε% of the collected Δqlg(m) values. The value of ε is a design parameter that we can use to achieve different trade-offs between clear-channel performance and noisy-channel performance. Empirically, it has been found that ε=0.1 provides a good trade-off, as this choice eliminates essentially all pops caused by gain bit errors, and yet hardly cause any audible degradation to the codec output speech quality.

Figure 5:
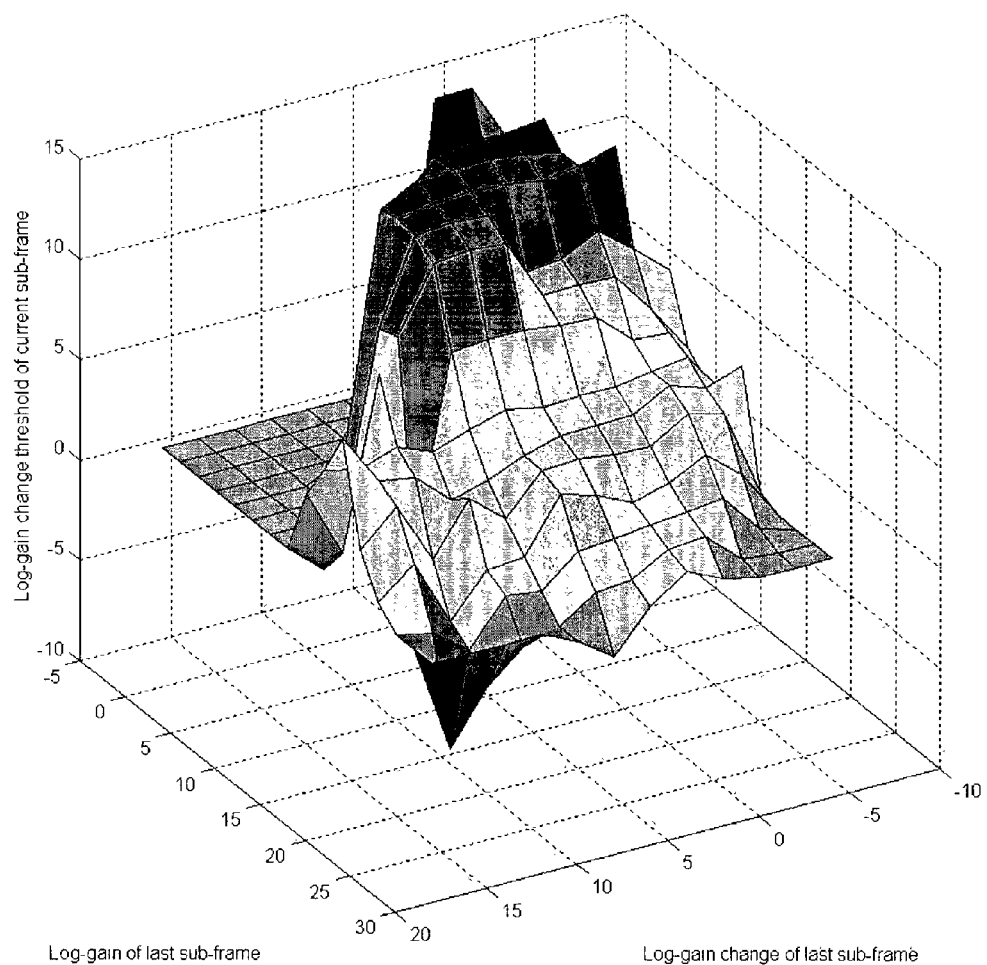
FIG. 5 is a graphical illustration of an exemplary threshold function operating in accordance with the present nvention.

FIG. 5 shows an example of the threshold function T(qlg(m−1), Δqlg(m−1)) depicted in a 3-dimensional plot, with the X-Y plane defined by qlg(m−1) and Δqlg(m−1), and the threshold values plotted along the Z axis. This threshold function was trained with ε=0.1 on a 57-minute training file containing 8 kHz sampled clean speech, noisy speech, music, and network signaling tones. The sub-frame size used was 5 ms. That is, the log-gain is sampled once every 5 ms.

The threshold function of FIG. 5 is provided as an example. Therefore, the present invention is not to be limited to this function. Alternate threshold functions may exist within the scope of the present invention. For example, an alternate threshold function may be dynamic in that it adapts to the input signal level. This can easily be achieved by changing the label of X axis in FIG. 5 from "log-gain of last sub-frame" to "log-gain of last sub-frame relative to the input signal level." Changing from an absolute log-gain to a relative log-gain makes the threshold function adaptive to the input signal level.

Figure 6:
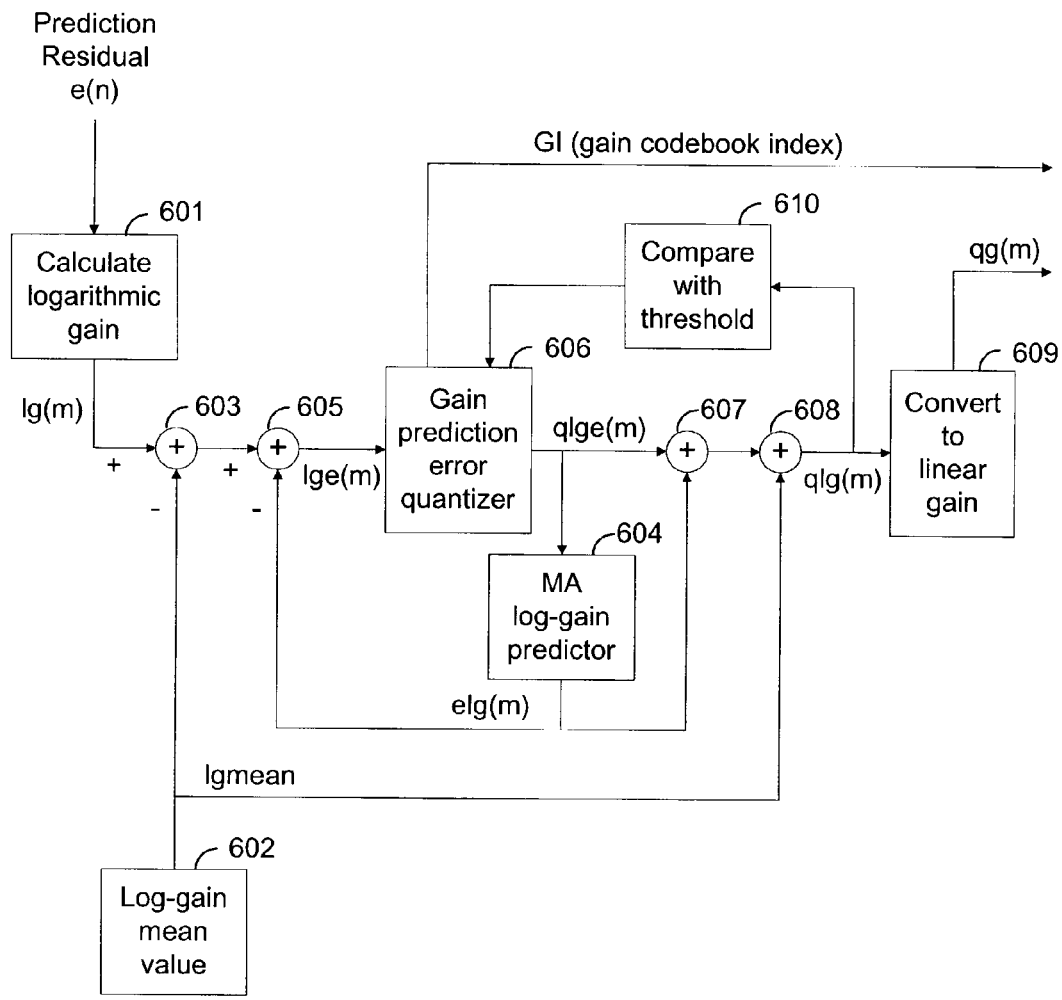
FIG. 6 is a block diagram illustration of an exemplary encoder constructed and arranged in accordance with the present invention when applied to an MA-predictive log-gain quantizer.

FIG. 6 shows the encoder of the preferred embodiment of the present invention when applied to an MA-predictive log-gain quantizer. This is just a slightly modified version of the conventional encoder in FIG. 3. The only new block added is block 610. All functional blocks work the same way as similarly numbered corresponding blocks in FIG. 3, except the gain prediction error quantizer (block 606) and the new block 610.

When the current sub-frame (with index m) of residual signal {e(n)} comes in, blocks 601 through 608 perform their normal function just like blocks 301 through 308 in FIG. 3. The resulting quantized log-gain qlg(m) is passed to block 610. Based on qlg(m−1) and Δqlg(m−1), or the log-gain and the change of log-gain in the last sub-frame, block 610 determines the threshold function T(qlg(m−1), Δqlg(m−1)). It accomplishes this by first determining which square in the X-Y plane defined by qlg(m−1) and Δqlg(m−1) the previous log-gain and log-gain change fall into, and then performing a table look-up from the stored threshold array to get T(qlg(m−1), Δqlg(m−1)). Block 610 then checks whether Δqlg(m)=qlg(m)−qlg(m−1)>T(qlg(m−1), Δqlg(m−1)). This can be accomplished by first calculating Δqlg(m)=qlg(m)−qlg(m−1) then comparing it with T(qlg(m−1), Δqlg(m−1)), or better yet (which will be clear later), by first calculating a new threshold F(qlg(m−1), Δqlg(m−1))=qlg(m−1)+T(qlg(m−1), Δqlg(m−1)), then comparing it with qlg(m). The two approaches are equivalent.

Note that T(qlg(m−1), Δqlg(m−1)) is a threshold for Δqlg(m), while F(qlg(m−1), Δqlg(m−1)) is a threshold for qlg(m). In fact, the F(qlg(m−1), Δqlg(m−1)) thresholds could have been directly trained and stored rather than T(qlg(m−1), Δqlg(m−1)). This approach could have saved the addition in F(qlg(m−1), Δqlg(m−1))=qlg(m−1)+T(qlg(m−1), Δqlg(m−1)) during the gain encoding operation. However, this complexity saving is negligible, and the resulting 3-D plot for the F(qlg(m−1), Δqlg(m−1)) threshold array would look very different from FIG. 5.

For ease of implementation, the quantizer codebook in block 606 is sorted in an ascending order, with codebook index 0 corresponding to the smallest value and the largest codebook index corresponding to the largest codebook value.

If the decoded log-gain is greater than the newly calculated threshold, that is, if qlg(m)>F(qlg(m−1), Δqlg(m−1)), then block 610 signals block 606 to use the next largest codebook value. That is, the gain index GI is reduced by one, and the next largest codebook value becomes the new value of qlge(m). Adders 607 and 608 then perform their normal functions to get a new and smaller quantized log-gain value qlg(m). Then, this smaller qlg(m) is compared with F(qlg(m−1), Δqlg(m−1)) again. This process is repeated until block 606 puts out the first codebook value that gives rise to a quantized log-gain qlg(m) no greater than the threshold F(qlg(m−1), Δqlg(m−1)). This codebook value and the corresponding gain index GI are the final outputs of block 606. The corresponding quantized log-gain qlg(m) is the final version that will be used. Block 609 then converts this quantized log-gain into quantized excitation gain in the linear domain for use in the rest of the encoder of the target codec.

In other words, the above iterative process attempts to find the largest gain codebook value that satisfies qlg(m)≦F(qlg(m−1), Δqlg(m−1)). Most of the time there exists a gain codebook value satisfying this constraint. In some extremely rare cases, even the smallest gain codebook value cannot satisfy the constraint qlg(m)≦F(qlg(m−1), Δqlg(m−1)). When this happens, block 606 simply uses the smallest codebook value and GI=0 as its outputs.

Figure 7:
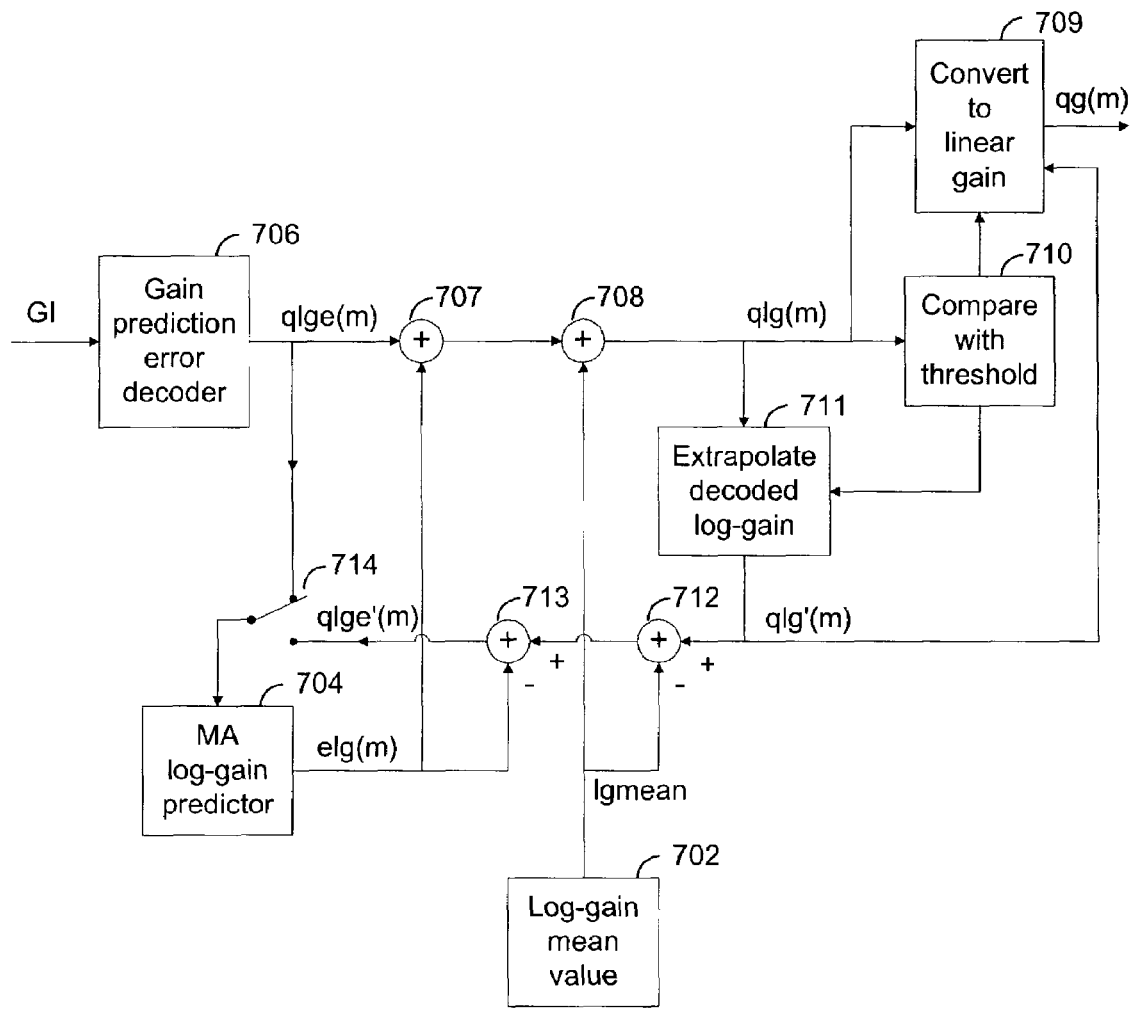
FIG. 7 is a block diagram illustration of an exemplary decoder constructed and arranged in accordance with the present invention when applied to an MA-predictive log-gain quantizer.

FIG. 7 shows the decoder of the preferred embodiment of the present invention when applied to an MA-predictive log-gain quantizer. This is again a modified version of the conventional decoder in FIG. 4. The new blocks added are blocks 710 through 713. The functional blocks 702, 704, and 706 through 709 work the same way as similarly numbered corresponding blocks in FIG. 4.

The default position of the switch 714 is in the upper position at the beginning of the gain decoding operation for each sub-frame. Blocks 702, 704, 706, 707, and 708 work normally like similarly numbered blocks in FIG. 4 to calculate the first decoded log-gain qlg(m). The function of block 710 is similar to that of block 610 in FIG. 6. Block 710 calculates $F(qlg(m-1), \Delta qlg(m-1))$ and then compares the decoded log gain $qlg(m)$ with this threshold. If $qlg(m) \leq F(qlg(m-1), \Delta qlg(m-1))$, or if GI=0, then block 710 signals block 709 to convert this quantized log-gain $qlg(m)$ into quantized excitation gain $qg(m)$ in the linear domain for use in the rest of the decoder of the target codec. The operations of block 711 through 713 are skipped, and switch 714 remains at the upper position. The gain decoding operation for the current sub-frame is completed.

If, on the other hand, $qlg(m)>F(qlg(m-1), \Delta qlg(m-1))$ and GI>0, then block 710 signals block 711 to extrapolate a log-gain value $qlg'(m)$ for the current sub-frame from the decoded log-gains of previous sub-frames $qlg(m-i)$, $i \geq 1$. The extrapolation of log-gain can be done in a number of ways. The simplest way, as used in the preferred embodiment, is just to copy the decoded log-gain of the last sub-frame. That is, set $qlg'(m)$ equal to $qlg(m-1)$. Block 710 also signals block 709 to convert this extrapolated log-gain $qlg'(m)$ into quantized excitation gain $qg(m)$ in the linear domain for use in the rest of the decoder of the target codec. The adders 712 and 713 then subtract lgmean (long-term mean of log-gains) and elg(m) (estimated log-gain from MA log-gain predictor) from $qlg'(m)$, respectively. The switch 714 is moved to the lower position to allow the resulting value, $qlge'(m)=qlg'(m)-lgmean-elg(m)$, to update the memory of the MA log-gain predictor. After that, the switch 714 goes back to its default upper position in preparation for gain decoding of the next sub-frame. This completes the gain decoding operation for the current sub-frame in the case of $qlg(m)>F(qlg(m-1), \Delta qlg(m-1))$ and GI>0.

The preferred embodiment of an MA-predictive log-gain quantizer, as described above, has been implemented in a two-stage noise feedback codec, as described in U.S. patent application Ser. No. 09/722,077. With the choice of $\epsilon=0.1$, the resulting system gave essentially identical perceptual speech quality as the original codec without this gain bit error concealment scheme when there were no bit errors. On the other hand, when the gain codebook index was subject to 0.1% of bit errors, the original codec without gain bit error concealment produced many audible big pops and glitches due to gain bit errors, while this gain bit error concealment scheme described above was able to eliminate essentially all such big pops and glitches.

Reducing the dynamic range of the gain codebook entries can also eliminate such big pops and glitches. However, it has been found that to completely eliminate such big pops and glitches, the gain codebook dynamic range had to be reduced so much that the clear-channel performance of the codec was degraded to a much larger extent than the gain bit error concealment scheme described above. Therefore, by exploiting the redundancy in natural speech, the present invention is able to achieve a much better trade-off between clear-channel and noisy-channel performance.

In the description of the preferred embodiment above, it is generally assumed that the threshold function $T(qlg(m-1), \Delta qlg(m-1))$ is a fixed function of the quantized log-gain $qlg(m-1)$. In practice, however, such a threshold function would be sub-optimal if the input signal level differs significantly from the signal level used in training the threshold function.

Consider the following example. Most speech codecs are optimized for an input signal level of −26 dBov, which means that the long-term average of the signal magnitude in the active speech segments of the input signal is 26 dB below the point of digital overload (the largest magnitude representable by the digital representation). Suppose the threshold function $T(qlg(m-1), \Delta qlg(m-1))$ is trained with a training file that has an average input signal level of −26 dBov. Furthermore, suppose in actual coding, the input signal has an average input signal level of −16 dBov. Then, on average the quantized log-gain $qlg(m-1)$ would be 10 dB higher than the quantized log-gain obtained during the training of the threshold function.

Therefore, from FIG. 5, it can be seen that the threshold function will be smaller than it should be, resulting in too much limitation of the allowed up-side log-gain changes. This would degrade the clear-channel performance of the codec. On the other hand, if the actual input signal has an average input signal level of −36 dBov, then there would be too little gain limitation, resulting in much more big pops when gain bits are in error. In either case, a fixed threshold function $T(qlg(m-1), \Delta qlg(m-1))$ becomes sub-optimal when the input signal level differs significantly from the signal level used in training the threshold function.

The gain bit error concealment scheme of the present invention described above can be made more robust to input signal level variations by making the threshold function $T(qlg(m-1), \Delta qlg(m-1))$ adaptive to the input signal level. A simple way to accomplish this is mentioned above. Here a more detailed description of a preferred embodiment employing such a level-adaptive threshold function will be given in this section. Whether such a level-adaptive threshold function should be used is a design choice. The gain bit error concealment scheme, also described above (with a non-adaptive threshold function), is simple to implement but gives sub-optimal performance if the input signal level differs significantly from the nominal input level. With a little more complexity, the level-adaptive threshold function and the corresponding gain bit error concealment scheme gives better performance for input signal levels significantly higher or lower than the nominal input level.

The key to making the threshold function adaptive to input signal level is to make the threshold function dependent not on the absolute quantized log-gain $qlg(m-1)$, but on the quantized log-gain relative to (or normalized by) the input signal level, or $qlg'(m-1)=qlg(m-1)-lvl(m-1)$, where $lvl(m-1)$ is the estimated input signal level, expressed in the logarithmic domain. With such a change, the X axis in FIG. 5 becomes "log-gain of last sub-frame relative to the input signal level," and therefore the threshold function $T(qlg'(m-1), \Delta qlg(m-1))$ becomes adaptive to the input signal level implicitly, even though the entries of the threshold function matrix that are stored are still constants.

The training of the threshold function $T(qlg'(m-1), \Delta qlg(m-1))$ can be accomplished in a number of ways. One way is to concatenate training signal segments of different signal levels into a single training data file, and then follow the procedure above. Another way is to use multiple training data files, each with a given signal level. A threshold matrix is obtained for each of the multiple training files, and then the resulting threshold matrices are averaged to obtain a single threshold matrix. Although the resulting threshold matrix will not be identical to the one shown in FIG. 5, it has a similar shape. A good compromise between clear-channel and noisy-channel performance is obtained by eliminating 0.02% (i.e., $\epsilon=0.02$) of the largest gain changes in each bin as the outliers.

It should be noted that the only difference between level-adaptive version and non-adaptive version of the gain bit error concealment scheme is in the way the table look-up of the threshold function is performed. In the non-adaptive system, the absolute quantized log-gain $qlg(m-1)$ is used as the X coordinate when identifying the bin (or square) in the X-Y plane to use for table look-up, while in the level-adaptive system the normalized log-gain qlg'(m−1)=qlg(m−1)−lvl(m−1) is used as the X coordinate instead. All other gain encoding and decoding procedures are unchanged.

A key issue in the level-adaptive threshold function is the estimation of the input signal level lvl(m−1). Since table look-up of the threshold function T(qlg'(m−1), A qlg(m−1)) needs to be performed at both the encoder and the decoder, the estimated input signal level lvl(m−1) also needs to be calculated at both the encoder and the decoder. Therefore, input signal level should be estimated from the signals or parameters that are available at both the encoder and the decoder.

In the preferred embodiment of the present invention, a simple yet effective estimator of the input signal level is used. This signal level estimator is described below. Its estimation of the input signal level is completely driven by the quantized log-gain qlg(m−1). The basic idea of this level estimator is as follows. The estimator maintains a running maximum lmax, a running minimum lmin, and a running mean lmean for the log-gain. If the quantized log-gain qlg(m−1) is greater than the running maximum lmax, it becomes the new running maximum; otherwise, the running maximum lmax is exponentially attenuated toward the running mean lmean. Similarly, if the quantized log-gain qlg(m−1) is less than the running minimum lmin, it becomes the new running minimum lmin; otherwise, the running minimum lmin is exponentially attenuated toward the running mean lmean. After the running maximum lmax and the running minimum lmin are updated at each sub-frame, the average of these two quantities, (lmax+lmin)/2, is passed through a first-order all-pole filter to update the running mean lmean. In other words, the running mean lmean is a smoothed version of (lmax+lmin)/2, the mean of the running maximum and the running minimum at each sub-frame.

Once lmean and lmax are updated at each sub-frame, a threshold lth is calculated as lth=lmean+0.2 (lmax−lmean). If the quantized log-gain qlg(m−1) is greater than this threshold lth, then qlg(m−1) is passed through a second-order all-pole filter to obtain an updated output estimated signal level lvl(m−1); otherwise, no change is made to the estimated signal level, i.e., the estimated signal level of the previous sub-frame is used as the output of the signal level estimator.

A detailed description of this signal level estimator algorithm is given below. Note that all log-gain are defined as base-2 logarithm of the average signal power per sample for each sub-frame. Also, for simplicity, the index m−1 in qlg(m−1) and lvl(m−1) will be dropped in the following description.

At codec initialization, the related variables are initialized as follows: lmax=−100, lmin=100, lmean=12.5, lvl=17, x=17, where x is an intermediate variable used to hold the state of the second-order smoothing filter for the output estimated signal level. At each sub-frame, the encoder or the decoder updates the output estimated signal level lvl as follows. Note that lmax, lmin, lmean, x, and lvl all serve as both input arguments and output arguments of the signal level estimator, which is called once a sub-frame.

Signal Level Estimator Algorithm:
1. If qlg>lmax, set lmax=qlg; otherwise, set lmax←lmean+(4095/4096)(lmax−lmean).
2. If qlg<lmin, set lmin=qlg; otherwise, set lmin←lmean+(4095/4096)(lmin−lmean).
3. Update lmean←(511/512)lmean+(1/512)[(lmax+lmin)/2].
4. Calculate lth=lmean+0.2 (lmax−lmean).
5. If qlg>lth, update x and lvl as x←(255/256)x+(1/256) qlg, and lvl←(255/256)lvl+(1/256)x ; otherwise, leave x and lvl unchanged (keep their respective values from the previous sub-frame).

The output of this signal level estimator is a very smooth and slow-varying estimate of signal level, lvl, which depends mainly on the long-term average of the signal level during the active portion of the signal (that is, the silence portion is discarded in the level estimation).

Note that all the specific parameter values given above are just example values, and the present invention is in no way limited by these particular parameter values. Also note that this signal level estimator can be used not only for the present invention of a gain bit error concealment scheme, but also for other applications where an estimated long-term signal level will be useful. These other applications include, but are not limited to, Voice Activity Detector (VAD) and speech signal classifier in variable-rate speech coding or frame erasure concealment.

Comparing with the non-adaptive version described in previous sections, it is found that the level-adaptive version of the gain bit error concealment scheme described in this section achieves more consistent clear-channel and noisy-channel performance across a wide range of input signal levels. In particular, the level-adaptive version improves the clear-channel performance for high-level signals, and at the same time improves the noisy-channel performance for low-level signals.

Figure 8:
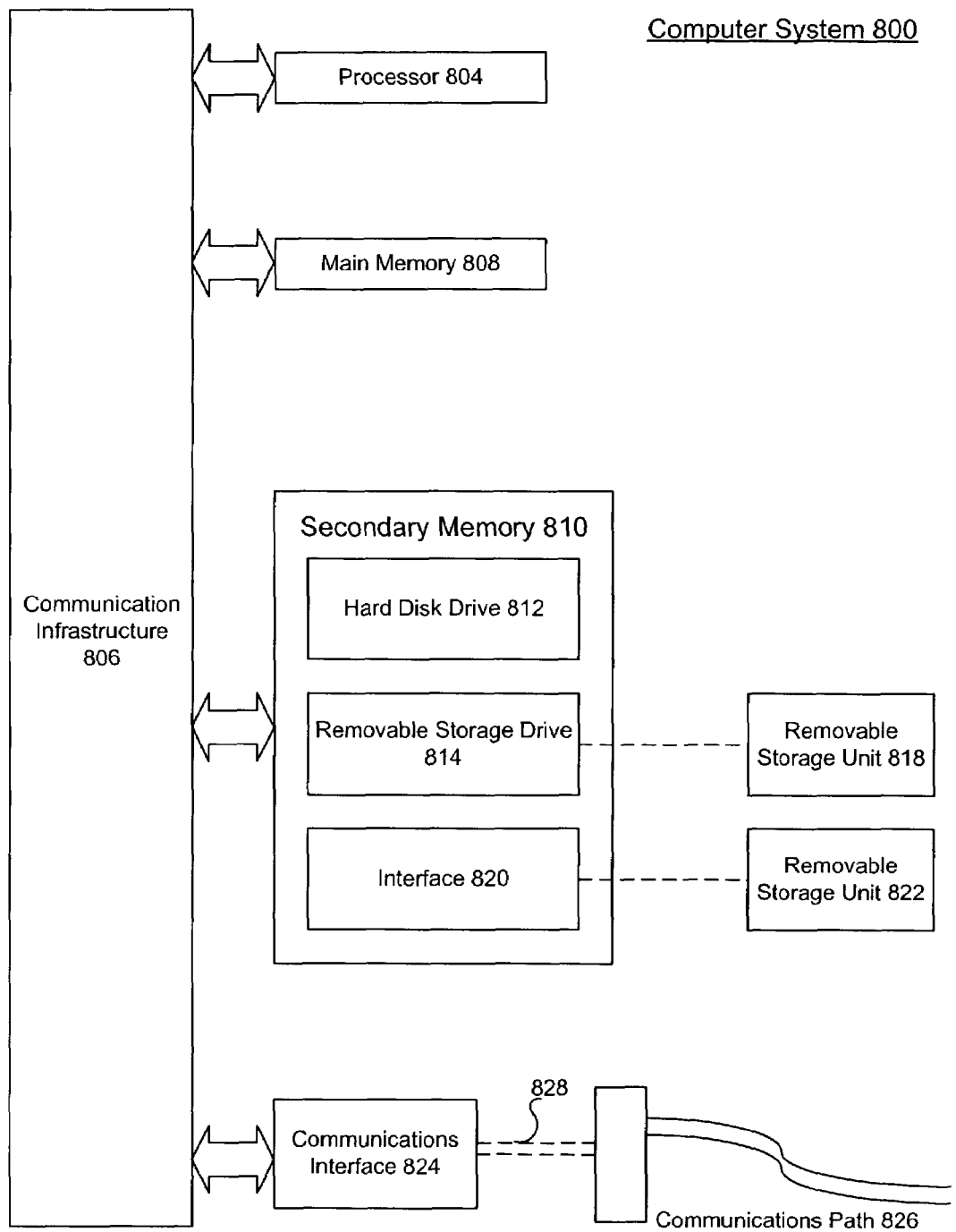
FIG. 8 is a block diagram illustration of an exemplary computer system on which the present invention can be practiced.

The following description of a general purpose computer system is provided for completeness. The present invention can be implemented in hardware, or as a combination of software and hardware. Consequently, the invention may be implemented in the environment of a computer system or other processing system. An example of such a computer system 800 is shown in FIG. 8. In the present invention, all of the elements depicted in FIGS. 1-4 and 6-7, for example, can execute on one or more distinct computer systems 800, to implement the various methods of the present invention. The computer system 800 includes one or more processors, such as a processor 804. The processor 804 can be a special purpose or a general purpose digital signal processor. The processor 804 is connected to a communication infrastructure 806 (for example, a bus or network). Various software implementations are described in terms of this exemplary computer system. After reading this description, it will become apparent to a person skilled in the relevant art how to implement the invention using other computer systems and/or computer architectures.

The computer system 800 also includes a main memory 808, preferably random access memory (RAM), and may also include a secondary memory 810. The secondary memory 810 may include, for example, a hard disk drive 812 and/or a removable storage drive 814, representing a floppy disk drive, a magnetic tape drive, an optical disk drive, etc. The removable storage drive 814 reads from and/or writes to a removable storage unit 818 in a well known manner. The removable storage unit 818, represents a floppy disk, magnetic tape, optical disk, etc. which is read by and written to by the removable storage drive 814. As will be appreciated, the removable storage unit 818 includes a computer usable storage medium having stored therein computer software and/or data.

In alternative implementations, the secondary memory 810 may include other similar means for allowing computer programs or other instructions to be loaded into the computer system 800. Such means may include, for example, a removable storage unit 822 and an interface 820. Examples of such means may include a program cartridge and cartridge interface (such as that found in video game devices), a removable memory chip (such as an EPROM, or PROM) and associated socket, and other removable storage units 822 and interfaces 820 which allow software and data to be transferred from the removable storage unit 822 to the computer system 800.

The computer system 800 may also include a communications interface 824. The communications interface 824 allows software and data to be transferred between the computer system 800 and external devices. Examples of the communications interface 824 may include a modem, a network interface (such as an Ethernet card), a communications port, a PCMCIA slot and card, etc. Software and data transferred via the communications interface 824 are in the form of signals 828 which may be electronic, electromagnetic, optical or other signals capable of being received by the communications interface 824. These signals 828 are provided to the communications interface 824 via a communications path 826. The communications path 826 carries signals 828 and may be implemented using wire or cable, fiber optics, a phone line, a cellular phone link, an RF link and other communications channels.

In this document, the terms computer program medium and computer readable medium are used to generally refer to media such as the removable storage drive 814, and a hard disk installed in hard disk drive 812. These computer program products are means for providing software to the computer system 800.

Computer programs (also called computer control logic) are stored in the main memory 808 and/or the secondary memory 810. Computer programs may also be received via the communications interface 824. Such computer programs, when executed, enable the computer system 800 to implement the present invention as discussed herein. In particular, the computer programs, when executed, enable the processor 804 to implement the processes of the present invention. Accordingly, such computer programs represent controllers of the computer system 800. By way of example, in the embodiments of the invention, the processes/methods performed by signal processing blocks of encoders and/or decoders can be performed by computer control logic. Where the invention is implemented using software, the software may be stored in a computer program product and loaded into the computer system 800 using the removable storage drive 814, the hard drive 812 or the communications interface 824.

In another embodiment, features of the invention are implemented primarily in hardware using, for example, hardware components such as Application Specific Integrated Circuits (ASICs) and gate arrays. Implementation of a hardware state machine so as to perform the functions described herein will also be apparent to persons skilled in the relevant art(s).

The foregoing description of the preferred embodiments provide an illustration and description, but is not intended to be exhaustive or to limit the invention to the precise form disclosed. Modifications and variations are possible consistent with the above teachings, or may be acquired from practice of the invention.

What is claimed is:

1. A method of detecting bit errors in an input signal having at least a current signal segment and a previous signal segment, the previous signal segment having a log-gain value (qlg(m−1)), where m represents a current sub-frame index, and immediately preceding the current signal segment, the method comprising:
    estimating a level lvl(m−1) of the input signal;
    determining a log-gain value qlg(m) of the current signal segment within the input signal;
    determining a difference between the gain value of the current signal segment and the previous signal segment; and
    determining whether the difference exceeds a threshold;
    wherein the threshold (i) is adaptive to the input signal level and (ii) is a function of the previous signal segment log-gain value (qlg(m−1)) and an amount of change between the previous signal segment log-gain value (qlg (m−1)) and a log-gain value of signal segments prior to the previous signal segment.

2. The method of claim 1, wherein the signal segment includes a sub-frame.

3. A method of estimating a signal level of an input signal having at least a current signal segment and a previous signal segment, the previous signal segment having a log-gain value (qlg(m−1)), where m represents a current sub-frame index, the method comprising:
    determining (i) a running maximum value for the log-gain of the input signal (lmax), (ii) a running minimum value for the log-gain of the input signal (lmin), and (iii) a running mean value for the log-gain of the input signal (lmean);
    wherein if the log-gain qlg(m−1)>the running maximum (lmax), then qlg(m−1) is set to (lmax), otherwise (lmax) is exponentially attenuated toward the running mean (lmean); and
    wherein if the log-gain qlg(m−1)<the running minimum (lmin), then qlg(m−1) is set to (lmin), otherwise (lmin) is exponentially attenuated toward the running mean (lmean).

4. The method of claim 3, further comprising updating (lmin) and (lmax) at each sub-frame.

5. The method of claim 4, further comprising determining a threshold (lth) as a function of the running mean (lmean) and the running maximum (lmax).

6. The method of claim 5, further comprising updating the estimated level lvl(m−1) if the log-gain qlg(m−1)>the threshold (lth); and
    wherein if the log-gain qlg(m−1) is not greater than the threshold (lth), the signal level lvl(m−1) is not updated.

7. A computer readable medium carrying one or more sequences of one or more instructions for execution by one or more processors to perform a method of detecting bit errors in an input signal having at least a current signal segment and a previous signal segment, the previous signal segment having a log-gain value (qlg(m−1)), where m represents a current sub-frame index, and immediately preceding the current signal segment, the instructions when executed by the one or more processors, cause the one or more processors to perform the steps of:
    estimating a level lvl(m−1) of the input signal;
    determining a log-gain value qlg(m) of the current signal segment within the input signal;
    determining a difference between the gain value of the current signal segment and the previous signal segment; and
    determining whether the difference exceeds a threshold;
    wherein the threshold (i) is adaptive to the input signal level and (ii) is a function of the previous signal segment log-gain value (qlg(m−1)) and an amount of change between the previous signal segment log-gain value (qlg (m−1)) and a log-gain value of signal segments prior to the previous signal segment.

8. A computer readable medium carrying one or more sequences of one or more instructions for execution by one or more processors to perform a method of estimating a signal level of an input signal having at least a current signal segment and a previous signal segment, the previous signal segment having a log-gain value (qlg(m−1)), where m represents a current sub-frame index, the instructions when executed by the one or more processors, cause the one or more processors to perform the steps of:

determining (i) a running maximum value for the log-gain of the input signal (lmax), (ii) a running minimum value for the log-gain of the input signal (lmin), and (iii) a running mean value for the log-gain of the input signal (lmean);

wherein if the log-gain qlg(m−1)>the running maximum (lmax), then qlg(m−1) is set to (lmax), otherwise (lmax) is exponentially attenuated toward the running mean (lmean); and wherein if the log-gain qlg(m−1)<the running minimum (lmin), then qlg(m−1) is set to (lmin), otherwise (lmin) is exponentially attenuated toward the running mean (lmean).

9. An apparatus for detecting bit errors in an input signal having at least a current signal segment and a previous signal segment, the previous signal segment having a log-gain value (qlg(m−1)), where m represents a current sub-frame index, and immediately preceding the current signal segment, the apparatus comprising:

means for estimating a level lvl(m−1) of the input signal;

means for determining a log-gain value qlg(m) of the current signal segment within the input signal;

means for determining a difference between the gain value of the current signal segment and the previous signal segment; and means for determining whether the difference exceeds a threshold, the threshold (i) being adaptive to the input signal and (ii) is a function of the previous signal segment log-gain value (qlg(m−1)) and an amount of change between the previous signal segment log-gain value (qlg(m−1)) and a log-gain value of signal segments prior to the previous signal segment.

10. An apparatus for estimating a signal level of an input signal having at least a current signal segment and a previous signal segment, the previous signal segment having a log-gain value (qlg(m−1)), where m represents a current sub-frame index, the apparatus comprising:

means for determining (i) a running maximum value for the log-gain of the input signal (lmax), (ii) a running minimum value for the log-gain of the input signal (lmin), and (iii) a running mean value for the log-gain of the input signal (lmean);

wherein if the log-gain qlg(m−1)>the running maximum (lmax), then qlg(m−1) is set to (lmax), otherwise (lmax) is exponentially attenuated toward the running mean (lmean); and wherein if the log-gain qlg(m−1)<the running minimum (lmin), then qlg(m−1) is set to (lmin), otherwise (lmin) is exponentially attenuated toward the running mean (lmean).

* * * * *